(12) United States Patent
Kawamoto et al.

(10) Patent No.: US 7,382,628 B2
(45) Date of Patent: Jun. 3, 2008

(54) CIRCUIT-COMPONENT-CONTAINING MODULE

(75) Inventors: Eiji Kawamoto, Ibaraki (JP); Masaaki Hayama, Nara (JP); Masaaki Katsumata, Hirakata (JP); Hiroki Yabe, Moriguchi (JP); Takeo Yasuho, Neyagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/499,036

(22) PCT Filed: Sep. 4, 2003

(86) PCT No.: PCT/JP03/11296

§ 371 (c)(1),
(2), (4) Date: Jun. 17, 2004

(87) PCT Pub. No.: WO2004/026010

PCT Pub. Date: Mar. 25, 2004

(65) Prior Publication Data

US 2005/0051358 A1    Mar. 10, 2005

(30) Foreign Application Priority Data

Sep. 12, 2002   (JP)   ............................... 2002-266736

(51) Int. Cl.
*H05K 1/18* (2006.01)
(52) U.S. Cl. ..................... 361/764; 361/760; 174/52.1; 174/257

(58) Field of Classification Search ........ 361/760–764; 174/52.1, 52.2, 258–262; 257/659–660, 257/779–780, 787–790
See application file for complete search history.

(56) References Cited

U.S. PATENT DOCUMENTS

| | | | | |
|---|---|---|---|---|
| 5,397,864 A | * | 3/1995 | Rai et al. | 174/261 |
| 5,737,191 A | * | 4/1998 | Horiuchi et al. | 361/764 |
| 6,011,312 A | * | 1/2000 | Nakazawa et al. | 257/778 |
| 6,094,354 A | | 7/2000 | Nakajoh et al. | |
| 6,153,930 A | * | 11/2000 | Hori | 257/687 |
| 6,248,951 B1 | * | 6/2001 | Murali et al. | 174/52.2 |
| 6,734,535 B1 | * | 5/2004 | Hashimoto | 257/668 |
| 6,777,814 B2 | * | 8/2004 | Iwasaki et al. | 257/778 |

FOREIGN PATENT DOCUMENTS

| | | |
|---|---|---|
| JP | 10-163370 | 6/1998 |
| JP | 10-233463 | 9/1998 |
| JP | 11-163583 | 8/1999 |
| JP | 11-224918 | 8/1999 |
| JP | 2001-24312 | 1/2001 |
| JP | 2001-168493 | 6/2001 |
| JP | 2002-217329 | 8/2002 |

* cited by examiner

*Primary Examiner*—Tuan T. Dinh
(74) *Attorney, Agent, or Firm*—Steptoe & Johnson LLP

(57) ABSTRACT

A circuit component built-in module is provided in which a solder that is remelted when the circuit component built-in module is mounted on a motherboard by using the solder is prevented from flowing to the outside of the prescribed electrodes.

A first groove (116) is formed in a solder resist (106) located between two electrodes (103) to which a circuit component (104) is connected. A configuration is used in which the space between the first groove (116) and circuit component (104) is filled with a first insulating resin (107).

12 Claims, 5 Drawing Sheets

CIRCUIT-COMPONENT-CONTAINING MODULE

TECHNICAL FIELD

The present invention relates to a circuit component built-in module in which a circuit component is disposed on a wiring board and covered with an insulating resin.

BACKGROUND ART

Small electronic devices composed by mounting a plurality of circuit components on a wiring board have been rapidly finding wide application in recent years. Such conventional technology is disclosed, for example, in JP-A-11-163583, JP-A-2001-24312, and JP-A-2001-168493.

FIG. 8 shows a conventional circuit component built-in module 10 (referred to hereinbelow as a module). As shown in FIG. 8, a circuit pattern 11 and electrodes 30 are formed on the front surface of a wiring board 20 and then covered with a solder resist 60. Then, a circuit component 40 and electrodes 30 are connected with a solder 50. The surface of the wiring board 20 is then covered with an insulating resin 70 so as to enclose the circuit component 40. Finally, a module is obtained by providing an electromagnetic shielding layer 15 obtained by metal plating on the outermost layer. The wiring board 20 comprises an inner via 80, an internal circuit pattern 12, rear surface electrodes 13, and a solder 14 provided on the rear surface electrodes 13. Thus, the conventional module has a configuration in which the circuit component 40 and wiring board 20 are connected with the solder 50 and covered from above with the insulating resin 70.

On the other hand, in contemporary miniature circuit components with a size of 1.0×0.5 mm or 0.6×0.3 mm, the quantity of applied solder is reduced in order to avoid solder short circuiting during mounting. For this reason, a gap between the circuit component 40 and wiring board 20 after mounting is merely about 10 μm, and when the insulating resin 70 is formed, the insulating resin 70 cannot sufficiently penetrate into the gap portion between the circuit component 40 and wiring board 20 and a cavity appears therein. If the module and a motherboard are soldered together in a state in which a cavity appeared between the circuit component 40 and wiring board 20, the solder 50 is remelted inside the module. This molten solder 50 then flows out into the gap portion between the circuit component 40 and wiring board 20. As a result, short circuit occurs between the electrodes 30 and impairs the functions of the module. A method has been suggested for preventing the solder 50 from remelting inside the module when the module is mounted on the motherboard. With this method, a high-melting solder with a melting point of higher than 280° C. is used as the material for the solder 50, and the gap portion between the circuit component 40 and wiring board 20 is filled with an insulating resin by vacuum printing.

However, a process conducted at a temperature of 280° C. or higher is required when the circuit component 40 is mounted on the wiring board 20. Accordingly, the problem is that materials with low heat resistance, for example, quartz components and wiring boards composed of resins cannot be used for the circuit component 40 and wiring board 20 employed in the module.

The present invention resolves the above-described problems of the related art and provides a circuit component built-in module which has excellent connection reliability.

DISCLOSURE OF THE INVENTION

The present invention provides a circuit component built-in module comprising: a circuit component composed of at least one electronic component, a wiring board having a solder resist and electrodes for mounting the circuit component on the surface layer and having at least one wiring layer, a first insulating resin for covering the circuit component and the electrodes of the wiring board that are connected to the circuit component with a solder, and an electromagnetic shielding layer in the outermost layer, wherein a first groove is formed in the solder resist located between the two electrodes to which the circuit component is connected, and the space between the first groove and the circuit component is filled with the first insulating resin.

The present invention also provides a circuit component built-in module comprising a circuit component composed of at least one electronic component, a wiring board having a solder resist and electrodes for mounting the circuit component on the surface layer and having at least one wiring layer, a first insulating resin for covering the circuit component and the electrodes of the wiring board that are connected to the circuit component with a solder, and an electromagnetic shielding layer in the outermost layer, wherein a first groove is formed in the solder resist located between the two electrodes to which the circuit component is connected, the space between the first groove and the circuit component is filled with the second insulating resin, and the first insulating resin is formed so as to cover the circuit component.

DESCRIPTION OF THE PREFERRED EMBODIMENTS

The preferred embodiments of the present invention will be described hereinbelow by using the appended drawings.

The drawings are schematic drawings and do not represent each position on a correct scale.

Embodiment 1

Figure 1:
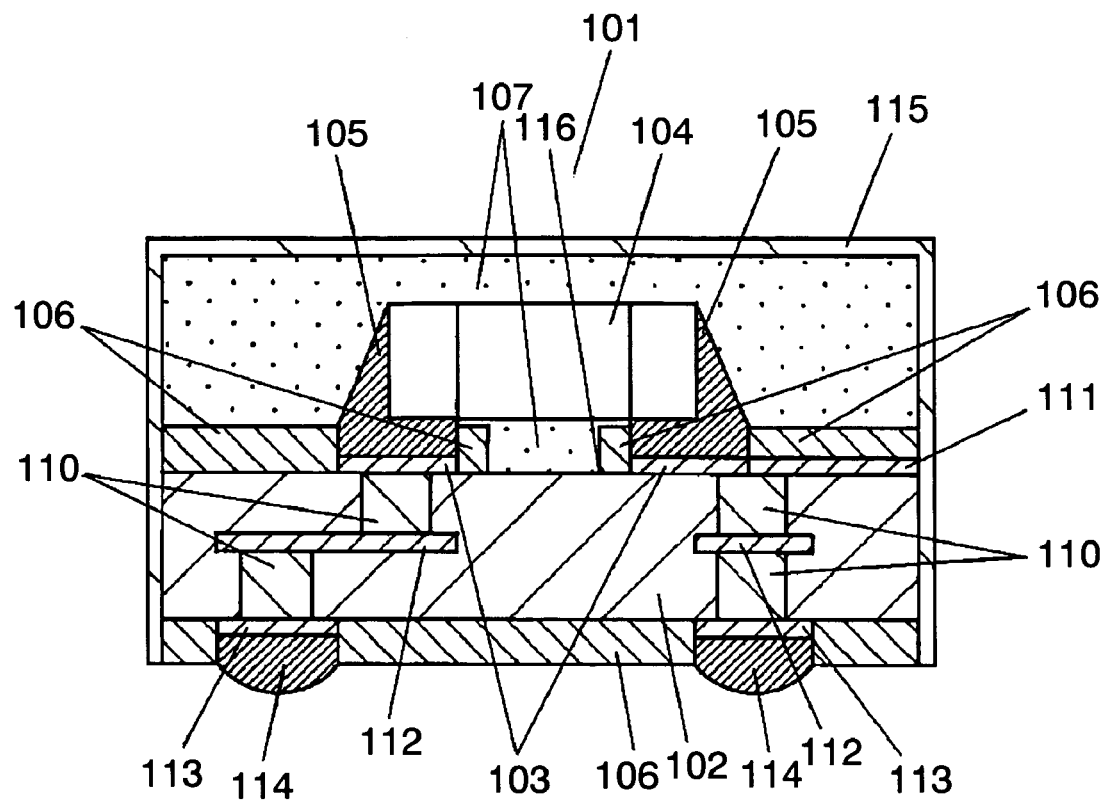
FIG. 1 is a cross-sectional view of the circuit component built-in module of Embodiment 1 of the present invention.

As shown in FIG. 1, a wiring board 102 is a multilayer wiring board in which electrodes 103 and a circuit pattern 111 are formed on the front surface, an inner circuit pattern 112 and an inner via 110 are formed inside, rear-surface electrodes 113 are formed on the rear surface, and solder resists 106 are formed on the front and rear surfaces.

The circuit pattern 111 and inner circuit pattern 112 are composed of an electrically conductive material, for example, a copper foil or a conductive resin composition.

In the present embodiment, a Cu foil is used for the aforesaid patterns. The inner via 110 is composed, for example, of a thermosetting conductive resin composition. The thermosetting conductive resin composition is formed, for example, by mixing metal particles with a thermosetting resin. Au, Ag, Cu, or the like can be used as the metal particles. Au, Ag, and Cu are preferred because they have a high electric conductivity. Among them, Cu is especially preferred because it has a high electric conductivity, low migration, and a low cost. For example, an epoxy resin, a phenolic resin, and a cyanate resin can be used as the thermosetting resin. An epoxy resin is especially preferred because it has high heat resistance.

A circuit component 104 is mounted on a prescribed position on the wiring board 102 by using a solder 105. The circuit component 104 is composed, for example, of an active component and a passive component. For example, semiconductor elements such as transistors, IC, and LSI can be used as the active component.

Chip components such as resistors, capacitors, and inductors, oscillators, filters, and the like can be used as the passive component.

Eutectic solders of a Pb—Sn system or Pb-free solders (for example, of an Sn—Ag—Cu system, Au—Sn system, or Sn—Zn system) can be used as the solder 105. All those solders have a melting point of 230° C. or less and can be used even with the components having low heat resistance. Furthermore, the solder 105 for mounting the circuit components 104 and a solder 114 for mounting the module on a motherboard (not shown in the figure) may be of the same material or of different materials. However, taking into account recent environmental concerns, it is preferred that a Pb-free solder be used.

A first insulating resin 107 is formed so as to cover completely the circuit component 104. The first insulating resin 107 is composed of a mixture comprising an inorganic filler and a thermosetting resin. For example, alumina, MgO, BN, AlN, silica, $BaTiO_3$, and the like can be used as the inorganic filler. An epoxy resin, a phenolic resin, and a cyanate resin are preferred as the thermosetting resin. An epoxy resin is especially preferred because it has high heat resistance.

Figure 2:
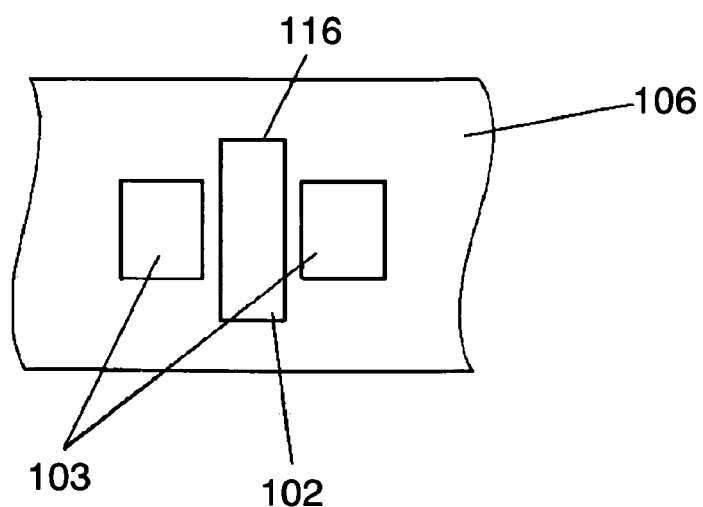
FIG. 2 is a top view of the main portion of the wiring board of Embodiment 1 of the present invention.

A metal film 115 obtained, for example, by plating is formed on the surface layer (outermost layer) of the first insulating resin 107, and this metal film acts as an electromagnetic shield layer. The metal film 115 is formed by using at least one material selected from the group including Au, Ag, Cu, Ni, Cr, Zn, Ti, Al, and the like. In the module 101 of the present embodiment, a first groove 116 is formed, as shown in FIG. 2, in the solder resist 106 located on the wiring board 102 right below the circuit component 104, as shown in FIG. 1. As a result, the space between the circuit component 104 and solder resist 106 that were usually spaced by only about 10 μm can be expanded by the thickness of the solder resist 106. The thickness of the solder resist 106 differs depending on the material used and it is usually about 30-40 μm. When a material with a thickness of 40 pm is used, the resulting gap between the circuit component 104 and wiring board 102 becomes about 50 pm. With such a gap of about 50 μm, the space right below the circuit component 104 can be easily filled with the first insulating resin 107. The width of the first groove 116 machined in the solder resist 106 is 50 μm or more. When the width of the first groove 116 is less than 50 μm, the groove is extremely narrow and has a high aspect ratio, from the standpoint of the thickness of the solder resist 106. As a result, it is very difficult to fill the first groove 116 with the first insulating resin 107. On the other hand, the following occurs when the width of the first groove 116 is equal to the spacing of electrodes 103, that is, when no solder resist 106 is present between the electrodes 103, as in the conventional example. When a solder paste (not shown in the figure) is printed, the solder paste flows out (oozes) between the electrodes 103. As a result the solder 105 is oversupplied, causing short circuiting of the solder 105 between the electrodes 103. In order to prevent this effect, it is important that the solder resist 106 be present around the electrodes 103. Taking the machining accuracy and material properties into account, it is necessary that the width of the solder resist 106 remaining between the electrodes 103 and the first groove 116 be 25 μm or more. In such a case the first groove 116 formed between the two electrodes is separated from each electrode 103 by 25 μm or more. Furthermore, the length of the first groove 116 is greater than the width of the circuit component 104 by 50 μm or more. As a result, a filling opening for filling the space right below the circuit component 104 with the first insulating resin 107 can be ensured. With the above-described structure, the gap between the circuit component 104 and the solder resist 106 that was previously difficult to be filled with the first insulating resin 107 can be easily filled with the first insulating resin 107. Furthermore, because the space between the electrodes 103 is filled with the first insulating resin 107 when the solder 105 is remelted, which occurs when the module 101 is mounted on a motherboard (not shown in the figure), the resin becomes a wall preventing the solder 105 from flowing out. As a result, short circuiting between the two electrodes 103 can be prevented.

Furthermore, it is important that the flexural modulus of the first insulating resin 107 be less than 20 GPa. The following occurs when a material with a flexural modulus of 20 GPa or more is used for the first insulating resin 107. Due to volume expansion during remelting of the solder 105, a stress acts upon the first insulating resin 107. At this time, due to a high flexural modulus, a stress trying to suppress the volume expansion of solder 105 also acts. Those stresses cannot be balanced, and the first insulating resin 107 is eventually cracked. As a result, the molten solder 105 flows out into the cracked portion, causing degradation of circuit component characteristics.

However, if the flexural modulus is less than 20 GPa, the first insulating resin 107 can deform and follow the volume expansion during melting of the solder 105. Therefore, no cracking occurs in the first insulating resin 107. As a result, because oozing of the molten solder 105 can be prevented, solder short circuiting does not occur. Connection reliability of the module 101 is thereby ensured.

Figure 3:
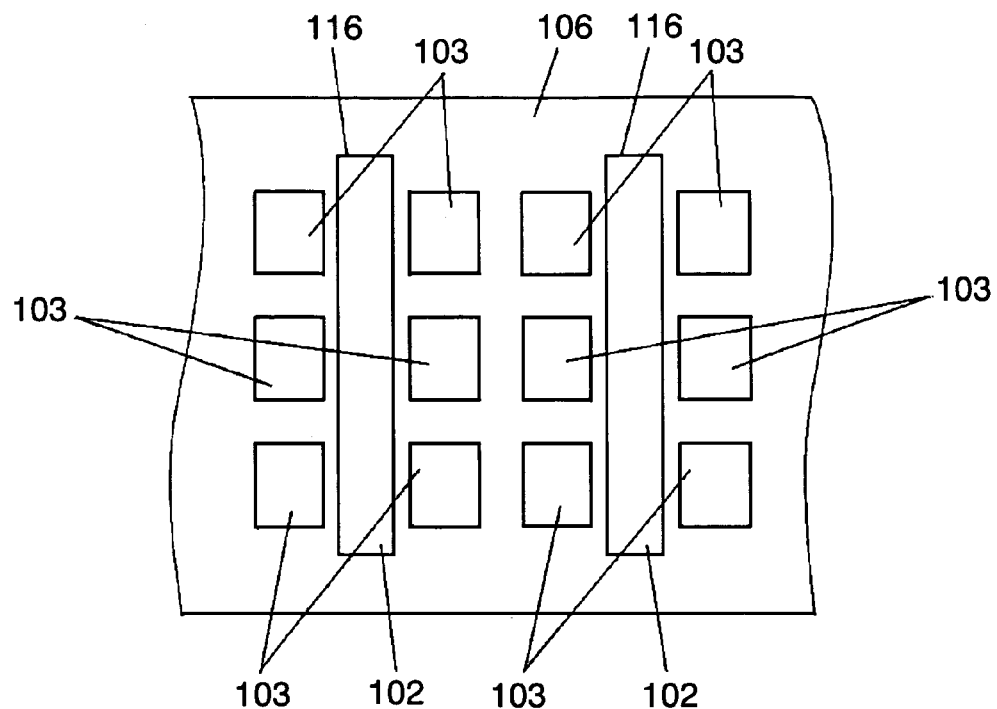
FIG. 3 is a top view of the main portion of the wiring board of Embodiment 1 of the present invention.

Furthermore, when a plurality of circuit components 104 are narrow adjacently mounted with a spacing of, for example, 250 μm or less, the adjacent first grooves are connected to each other as shown in FIG. 3. As a result, filling of the first insulting resin 107 can be conducted efficiently.

Figure 4:
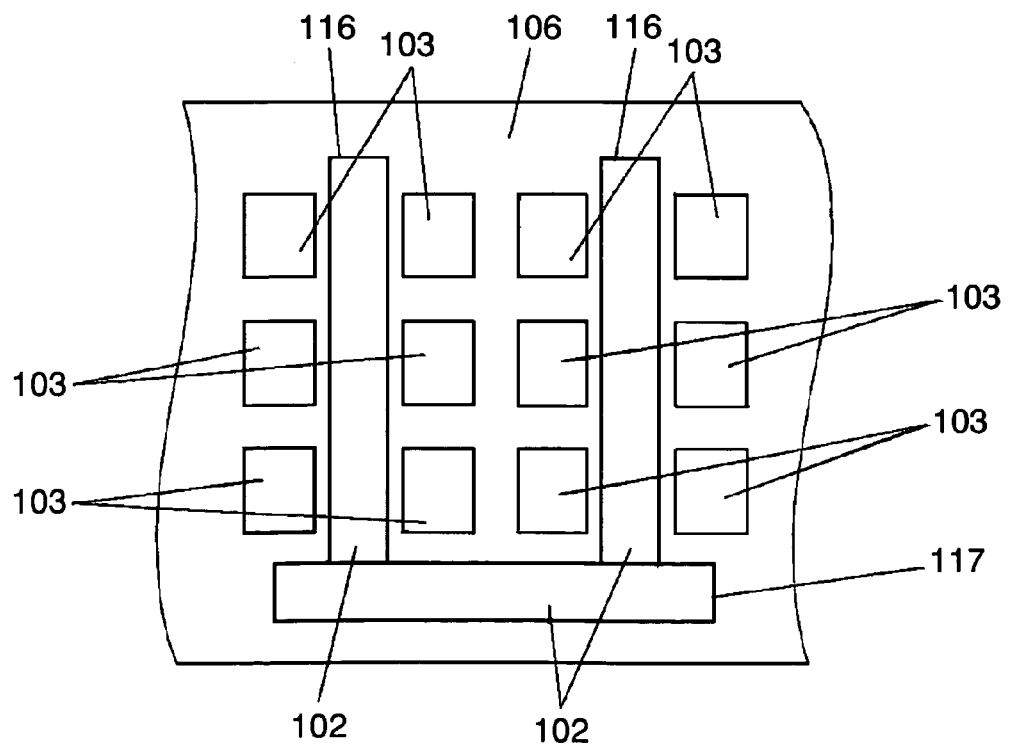
FIG. 4 is a top view of the main portion of the wiring board of Embodiment 1 of the present invention.
Figure 5:
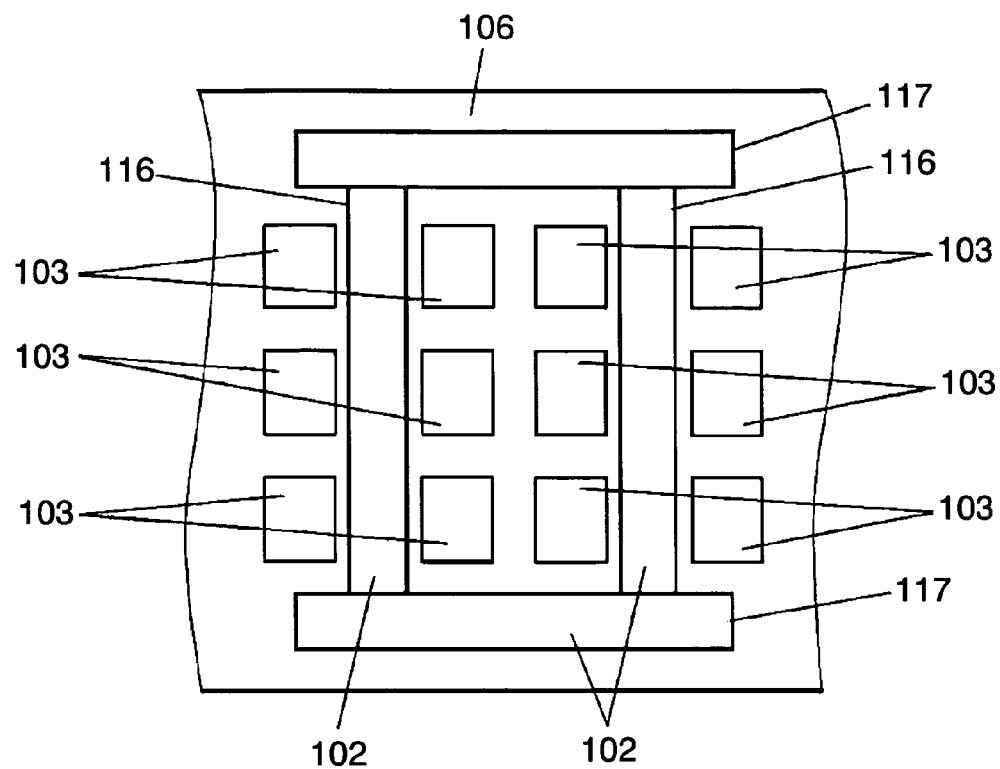
FIG. 5 is a top view of the main portion of the wiring board of Embodiment 1 of the present invention.

Further, as shown in FIG. 4, a second groove 117 with an opening wider than that of the first grooves 116 may be connected to ends of the first grooves 116. As a result, the space below the circuit components 104 can be filled with the first insulating resin 107 with higher reliability. Moreover, as shown in FIG. 5, the second grooves 117 may be provided in a plurality of places. In such a case, filling of the first insulating resin 107 can be conducted without selecting the directivity. As a result, the efficiency of operations can be increased.

As shown hereinabove, in Embodiment 1, first grooves 116 are formed in the solder resist 106 between the two electrodes 103 for mounting the circuit component 104 on the wiring board 102. As a result, the space between the circuit component 104 and wiring board 102 can be readily filled with the first insulating resin 107. Such a reliable introduction of the first insulating resin 107 between the circuit component 104 and wiring board 102 makes it possible to prevent the solder 105 that is remelted when the module 101 was mounted on a motherboard from flowing to the outside of the prescribed electrodes. Moreover, filling of the first insulating resin 107 can be also conducted in an easy manner when a plurality of circuit components 104 are mounted. As a result, as was described hereinabove, the remelted solder 105 can be prevented from flowing to the outside of the prescribed electrodes. Further, it is important that a material with a flexural modulus of less than 20 GPa be used for the first insulating resin 107. In such a case, because the first insulating resin 107 can follow the volume expansion of the remelted solder 105, the solder can be prevented from flowing out, without causing cracking.

Embodiment 2

Figure 6:
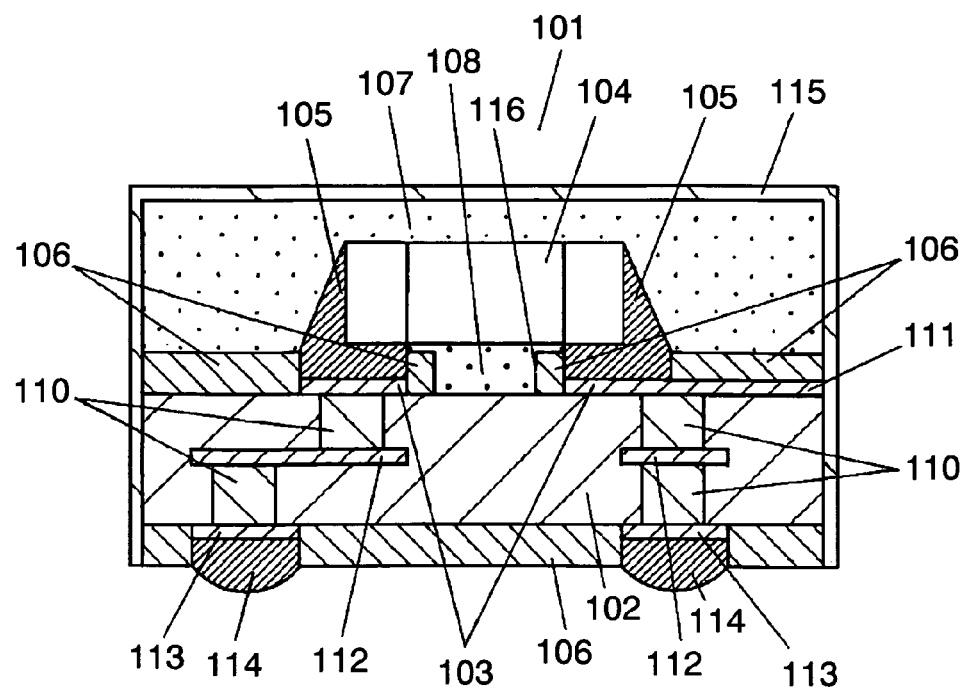
FIG. 6 is a cross-sectional view of the circuit component built-in module of Embodiment 2 of the present invention.

FIG. 6 is a cross-sectional view of a module 101 of Embodiment 2 of the present invention. Structural elements identical to those of Embodiment 1 are assigned with identical reference numerals and the explanation thereof is herein omitted.

As shown in FIG. 6 and FIG. 2, the first groove 116 is formed by machining the solder resist 106 right below the circuit component 104, similarly to Embodiment 1. As a result, a wide space is formed between the wiring board 102 and the circuit component 104. This space is filled with the second insulating resin 108, and the first insulating resin 107 is formed so as to cover the circuit component 104, second insulating resin 108, and wiring board 102.

A metal film 115 is formed, for example, by plating on the outermost layer, and used as an electromagnetic shielding layer.

Because only the space portion right below the circuit component 104 is filled with the second insulating resin 108, filling with the second insulating resin 108 can be conducted in an easy manner due to a capillary effect, without the formation of voids.

Further, it is important that the second insulating resin 108 have a flexural modulus of less than 20 GPa, similarly to the first insulating resin 107. For the reasons identical to those explained in Embodiment 1, if a material with a flexural modulus of 20 GPa or more is used for the second insulating resin 108, cracks appear in the second insulating resin 108 when the solder 105 is remelted. As a result, the melted solder 105 flows out into the cracked portion, causing degradation of circuit component characteristics. However, if the flexural modulus is less than 20 GPa, the volume expansion of the solder 105 during melting causes no cracking of the second insulating resin 108. As a result, the molten solder 105 is prevented from flowing out, and the solder short circuiting does not occur. The degradation of characteristics of module 101 can thus be prevented.

When a plurality of circuit components 104 are contained, the first groove 116 and the second groove 117 are provided on the wiring board 102 similarly to Embodiment 1, as shown in FIGS. 3 to 5. As a result, filling with the second insulating resin 108 can be favorably conducted.

As shown hereinabove, in Embodiment 2, the first groove 116 is formed in the solder resist 106 between the electrodes 103 for mounting the circuit component 104 on the wiring board 102. Then, the first groove 116 is filled in advance with the second insulating resin 108 prior to sealing the entire structure with the first insulating resin 107. The groove can be thus reliably filled with the second insulating resin 108.

Reliably introducing the second insulating resin 108 between the circuit component 104 and wiring board 102 makes it possible to prevent the solder 105 that is remelted when the module is mounted on a motherboard from flowing to the outside of the prescribed electrodes.

Further, it is important that a material with a flexural modulus of less than 20 GPa be used for the first and second insulating resins 107, 108.

In this case, volume expansion of the remelted solder 105 can be followed and therefore no cracking occurs in the first insulating resin 107 and second insulating resin 108. As a result, the solder 105 can be prevented from flowing out.

Embodiment 3

Figure 7:
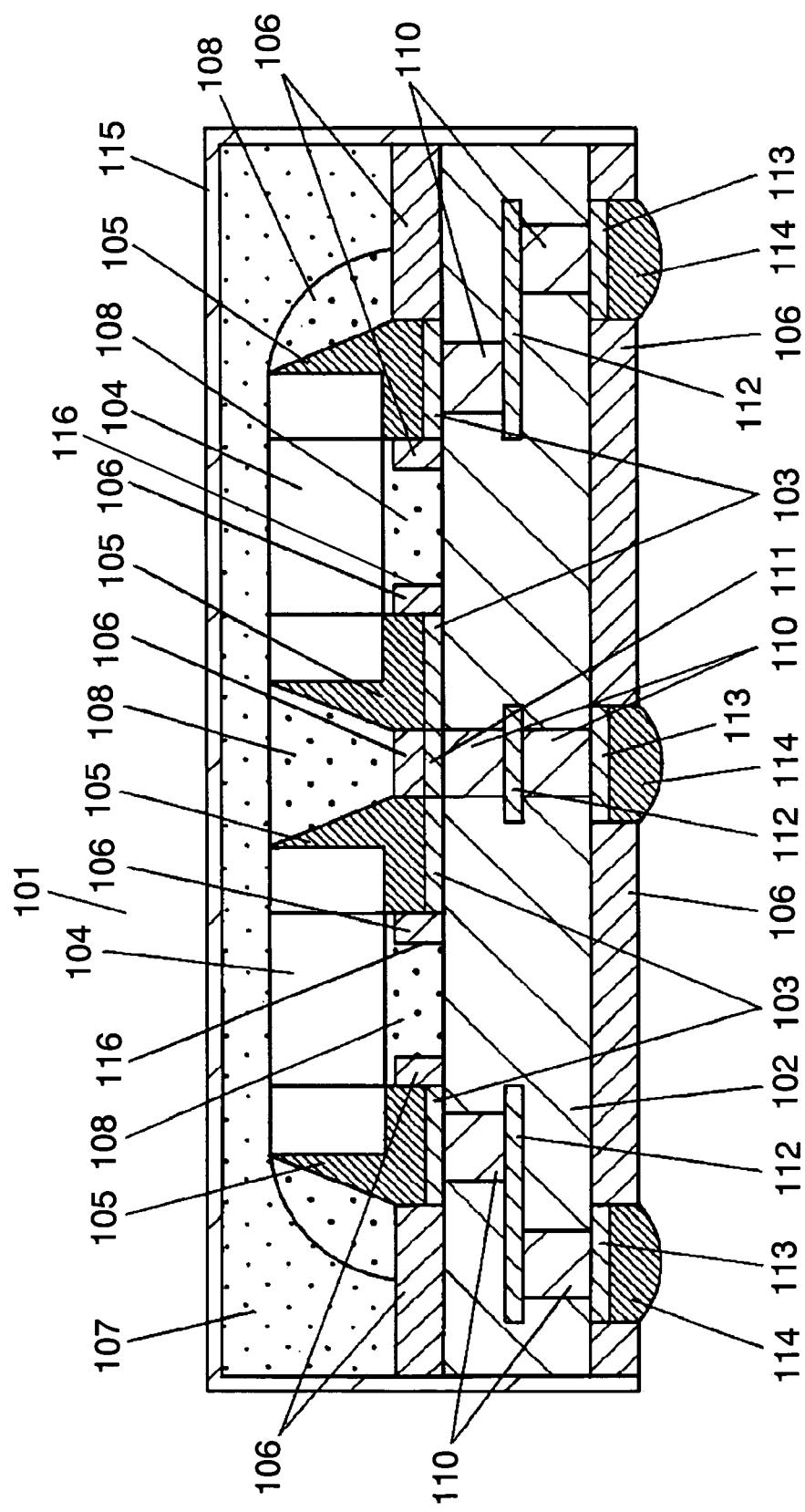
FIG. 7 is a cross-sectional view of the circuit component built-in module of Embodiment 3 of the present invention.
Figure 8:
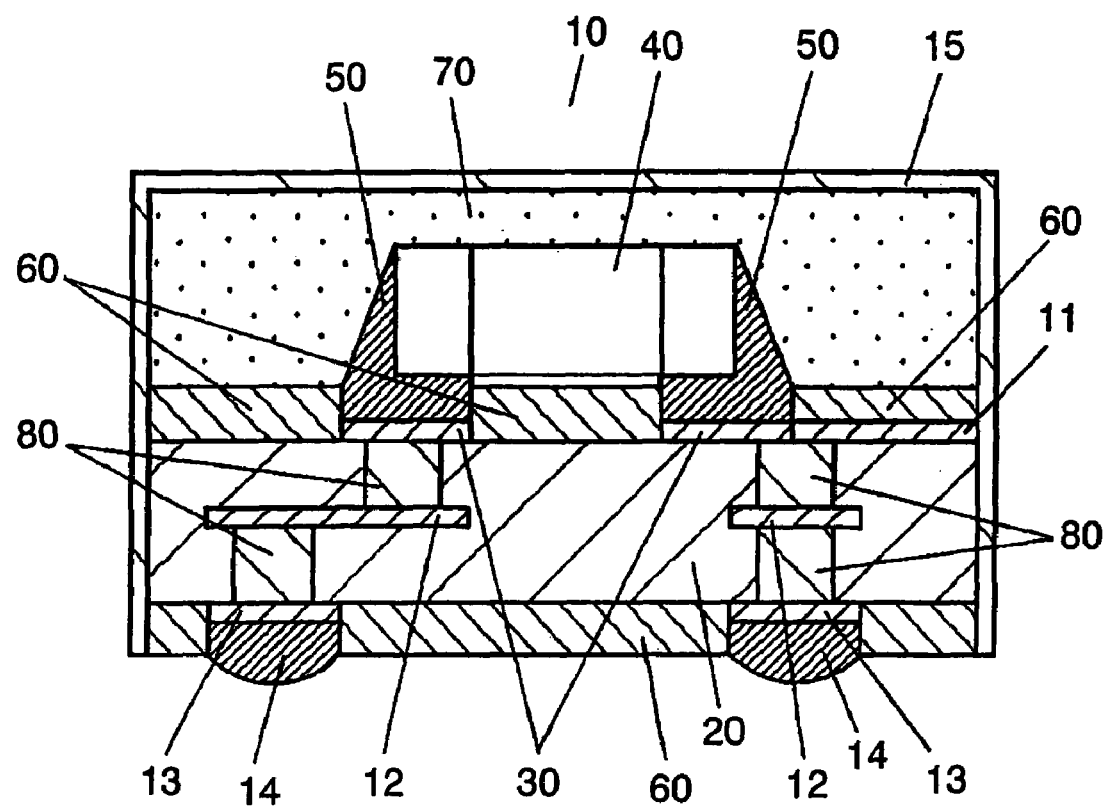
FIG. 8 is a cross-sectional view of a conventional module.

Structural elements identical to those of Embodiments 1 and 2 are assigned with identical reference numerals and the explanation thereof is herein omitted. As shown in FIG. 7 and FIG. 2, the first groove 116 is formed by machining the solder resist 106 right below the circuit component 104, similarly to Embodiment 2, and a wide space is formed between wiring board 102 and the circuit component 104. This space is filled with the second insulating resin 108, and the periphery of the circuit component 104 is covered with the second insulating resin 108. The first insulating resin 107 is thereafter formed so as to cover the circuit component 104, second insulating resin 108, and wiring board 102. A metal film 115 is then formed as the surface layer of the first insulating resin 107 to be used as an electromagnetic shielding layer.

When the space right below the circuit component 104 is filled with the second insulating resin 108, the resin is abundantly applied to the filling starting openings of the first groove 116 or second groove 117. As a result, the space below the circuit component 104 can be easily filled due to a capillary effect. The second insulating resin 108 that was not placed below the circuit component 104 is formed around the circuit component 104. As a consequence, it is not necessary to control thoroughly the application quantity of the second insulating resin 108 and the production process can be simplified. As described hereinabove, in Embodiment 3, the second insulating resin 108 can be reliably injected into the space between the circuit component 104 and the wiring board 102, which is the specific feature of Embodiment 2. Moreover, when the second insulating resin 108 is injected, it is not necessary to control thoroughly the application quantity of the resin and the production process can be simplified.

INDUSTRIAL APPLICABILITY

As described hereinabove, in accordance with the present invention, a space of no less than a certain size is formed between a circuit component and a wiring board by forming a first groove in a solder resist located in the surface layer of the wiring board. Then the space right below the circuit component is filled reliably with an insulating resin. Thus introducing the insulating resin reliably between the circuit component and wiring board makes it possible to prevent the solder that is remelted when a module is mounted on a motherboard from flowing to the outside of the prescribed electrodes. Moreover, filling with the insulating resin can be also easily conducted when a plurality of circuit components are mounted. Therefore, the same effect is demonstrated. Moreover, a material with a flexural modulus of less than 20 GPa is used for the insulating resin. As a result, the solder can be prevented from flowing out, without causing the appearance of cracks in the insulating resin.

The invention claimed is:

1. A circuit component built-in module comprising:
   a circuit component comprising at least one electronic component;
   a wiring board having a pair of electrodes mounting said circuit component on a surface layer of said wiring board, said wiring board having at least one wiring layer;
   a first insulating resin covering said circuit component and the pair of electrodes;
   an electromagnetic shielding layer in an outermost layer of the module; and
   a pair of solder resists corresponding to the pair of electrodes, the pair of solder resists spaced apart on the surface layer of the wiring board between the pair of electrodes and beneath the circuit component, each solder resist surrounding and adjoining an adjacent electrode, wherein the circuit component, the surface layer of the wiring board and the pair of solder resists define a volume that is filled with said first insulating resin.

2. The circuit component built-in module according to claim 1, wherein the width of said volume is at least 50 µm.

3. The circuit component built-in module according to claim 1, wherein said volume is separated from each electrode of said circuit component by at least 25 µm.

4. The circuit component built-in module according to claim 1, wherein the length of said volume is greater than the width of said circuit component by at least 50 µm.

5. The circuit component built-in module according to claim 1, wherein the flexural modulus of said first insulating resin is less than 20 GPa.

6. A circuit component built-in module comprising:
   a circuit component comprising at least one electronic component;
   a wiring board having a pair of electrodes mounting said circuit component on a surface layer of said wiring board, said wiring board having at least one wiring layer;
   a first insulating resin covering said circuit component and the pair of electrodes;
   an electromagnetic shielding layer in an outermost layer of the module; and
   a pair of solder resists corresponding to the pair of electrodes, the pair of solder resists spaced apart on the surface layer of the wiring board between the pair of electrodes and beneath the circuit component, each solder resist surrounding and adjoining an adjacent electrode, wherein the circuit component, the surface layer of the wiring board and the pair of solder resists define a volume filled with a second insulating resin.

7. The circuit component built-in module according to claim 6, wherein a solder portion joined to said circuit component is covered with said second insulating resin, and said circuit component is covered with said first insulating resin.

8. The circuit component built-in module according to claim 6, wherein the flexural modulus of said second insulating resin is less than 20 GPa.

9. The circuit component built-in module according to claim 6, wherein the width of said volume is at least 50 µm.

10. The circuit component built-in module according to claim 6, wherein said volume is separated from each electrode of said circuit component by at least 25 µm.

11. The circuit component built-in module according to claim 6, wherein the length of said volume is greater than the width of said circuit component by at least 50 µm.

12. A circuit component built-in module comprising a plurality of circuit components, each circuit component comprising at least one electronic component;
   a wiring board having a pair of electrodes for mounting said circuit component on a surface layer of said wiring board, said wiring board having at least one wiring layer;
   a first insulating resin for covering said circuit component and the pair of electrodes;
   an electromagnetic shielding layer in an outermost layer of the module; and
   a pair of solder resists corresponding to the pair of electrodes, the pair of solder resists positioned apart on the surface layer of said wiring board between the pair of electrodes and beneath the circuit component, each solder resist surrounding and adjoining an adjacent electrode, wherein the circuit component, the surface layer of the wiring board and the pair of solder resists define a volume filled with said first insulating resin.

* * * * *